US006734375B2

(12) United States Patent
Kawakita et al.

(10) Patent No.: US 6,734,375 B2
(45) Date of Patent: May 11, 2004

(54) CIRCUIT BOARD HAVING AN INTERSTITIAL INNER VIA HOLE STRUCTURE

(75) Inventors: Yoshihiro Kawakita, Osaka (JP); Daizo Andoh, Osaka (JP); Fumio Echigo, Osaka (JP); Tadashi Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 5 days.

(21) Appl. No.: 09/956,205

(22) Filed: Sep. 18, 2001

(65) Prior Publication Data

US 2002/0053465 A1 May 9, 2002

(30) Foreign Application Priority Data

Sep. 18, 2000 (JP) .......................... 2000-282120

(51) Int. Cl.⁷ ................................. H05K 1/11
(52) U.S. Cl. ................ 174/264; 174/255; 174/258; 428/304.4; 428/321.3
(58) Field of Search ................ 174/255, 256, 174/258, 260, 262–266; 361/792–795; 428/209, 210, 220, 901, 304.4, 321.3

(56) References Cited

U.S. PATENT DOCUMENTS

| | | | | |
|---|---|---|---|---|
| 4,383,363 A | * | 5/1983 | Hayakawa et al. | 174/254 |
| 4,967,314 A | * | 10/1990 | Higgins, III | 174/261 |
| 5,346,750 A | * | 9/1994 | Hatakeyama et al. | 361/749 |
| 5,473,119 A | * | 12/1995 | Rosenmayer et al. | 174/250 |
| 5,484,647 A | | 1/1996 | Nakatani et al. | |
| 5,639,528 A | | 6/1997 | Feit et al. | |
| 5,652,042 A | * | 7/1997 | Kawakita et al. | 252/511 |
| 5,677,393 A | | 10/1997 | Ohmori et al. | |
| 5,776,616 A | | 7/1998 | Kosuga et al. | |
| 5,851,646 A | | 12/1998 | Takahashi et al. | |
| 5,919,546 A | * | 7/1999 | Horiuchi et al. | 174/255 |
| 5,972,482 A | * | 10/1999 | Hatakeyama et al. | 428/209 |
| 6,251,502 B1 | * | 6/2001 | Yasue et al. | 174/255 |
| 6,323,439 B1 | * | 11/2001 | Kambe et al. | 174/255 |
| 6,326,694 B1 | * | 12/2001 | Hatakeyama et al. | 257/701 |

FOREIGN PATENT DOCUMENTS

| | | |
|---|---|---|
| JP | 7-147464 | 6/1995 |
| JP | 9-324060 | 12/1997 |
| JP | 10-251404 | 9/1998 |
| TW | 239916 | 2/1995 |
| TW | 340093 | 9/1998 |
| TW | 350815 | 1/1999 |

* cited by examiner

Primary Examiner—Evan Pert
Assistant Examiner—Jose H. Alcala
(74) Attorney, Agent, or Firm—Merchant & Gould P.C.

(57) ABSTRACT

A circuit board including a desired number of electrically insulating layers and wiring layers laminated alternately, and an inner via hole for securing an electrical connection between the wiring layers by compressing and hardening a conductive paste including a conductive particle and a resin. In the electrically insulating layer, a porous sheet is provided a resin sheet at least one surface, and the porous sheet is not impregnated with a resin at least at a central portion. A through hole penetrating the electrically insulating layer in the direction of the thickness of the electrically insulating layer is filled with a conductive paste including a conductive particle and a resin, and pores that are present inside the porous sheet are filled with laminated resin. The average hole diameter of the pores inside the porous sheet may be smaller than the average particle size of the conductive particle. Thereby, it is possible to make the insulating layer of the circuit board securing the interlayer electrically connection by an inner via hole including a conductive paste to be homogenized and ultra-thin and improve the reliability of the connection of the inner via hole.

11 Claims, 8 Drawing Sheets

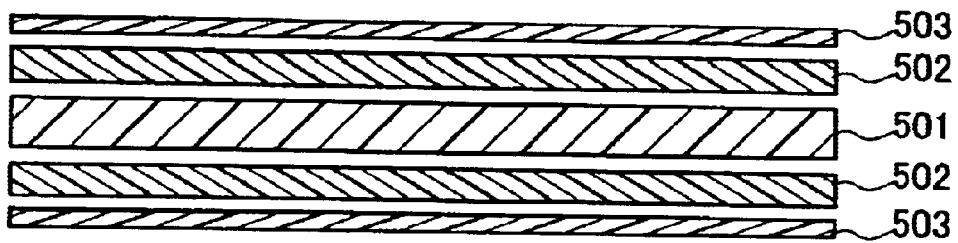
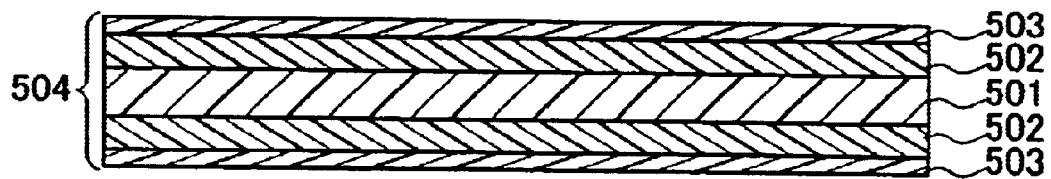
FIG. 5A
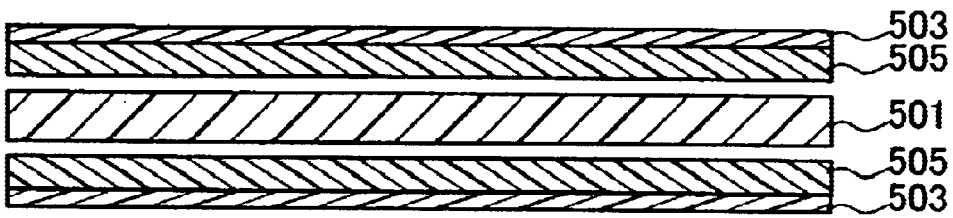
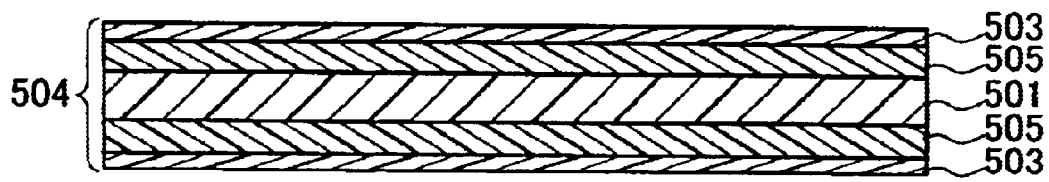
FIG. 5B

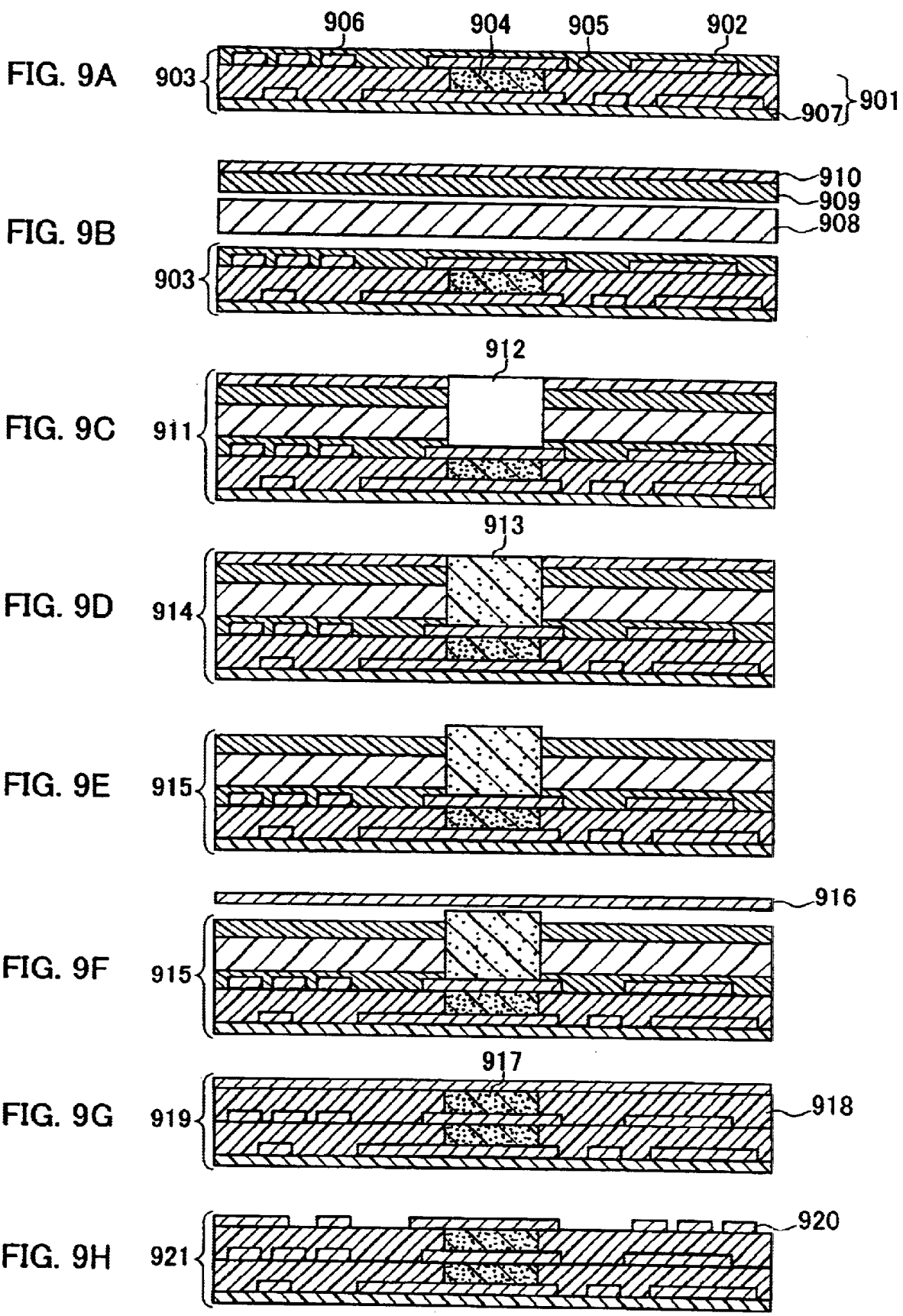

CIRCUIT BOARD HAVING AN INTERSTITIAL INNER VIA HOLE STRUCTURE

FIELD OF THE INVENTION

The present invention relates to a circuit board used for electronic equipment, more specifically, it relates to a circuit board having an interstitial inner via hole structure, a method for manufacturing the same, and a circuit board electrically insulating material used therefor.

BACKGROUND OF THE INVENTION

In recent years, as miniaturization, light weight and high performance of electronic equipment have been required, there has been a strong demand not only for a small size and light weight of a circuit board but also for higher speed for processing signals and high density mounting, and the like. In order to meet such demands, in the field of a circuit board technology, a technology for increasing the number of layers in a laminate structure, a technology of making the diameter of an inner via hole smaller, a technology for making circuit patterns finer, and the like have been developed rapidly, and circuit boards having various structures have been proposed or put into practice. As one example, the present assignee has developed a circuit board having an all-layer IVH (interstitial inner via hole) structure, in which the interlayer electric connection is secured with an inner via hole filled with a conductive paste in place of a through hole structure that has been a usual method in conventional circuit boards (see, for example, JP7 (1995)-14746 4 A). This circuit board has features that no through hole is needed and inner via holes can be arranged at arbitrary positions, and therefore, this circuit board has a high capacity of wiring, a high degree of freedom in design, shortening of wiring, etc. Thus, this circuit board is suitable for signal processing at high speed and high density mounting. In this circuit board, the conductive paste filled in the through hole is compressed and hardened simultaneously with molding of the laminate, thereby providing an inner via hole for securing an interlayer electrical connection. Therefore, this circuit board needs an electrically insulating material having such a compressive performance that permits sufficient compression of a conductive paste and is capable of maintaining the shape of the inner via hole. In general, as a conductive paste, a prepreg obtained by impregnating an aramid non-woven fabric with a thermosetting resin is used. The compressive performance of the aramid prepreg can be achieved by the melt flow of the thermosetting resin and the effect of defoaming of any remaining air foam. The maintenance of the shape of the inner via hole can be achieved by rigid property of the aramid non-woven fabric.

In the future, in a view that a circuit board will increasingly be required to have a finer circuit pattern, a smaller diameter of an inner via hole and an increase in number of the layers of the laminate structure and the like, it is extremely important to make the electrically insulating layer to be homogenized and ultra-thin. However, a non-woven fabric made of an aramid staple fiber having a diameter of 10–20 $\mu$m may cause a non-negligible non-uniformity of the physical property in a micro area depending on the direction of the fiber. Furthermore, a satisfactory thin layer cannot be obtained because there is a limitation to the number of fibers in the thickness direction.

SUMMARY OF THE INVENTION

With the foregoing in mind, it is an object of the present invention to provide a circuit board electrically insulating material and a circuit board, in which an electrically insulating layer is made to be homogenized and ultra-thin and the connection reliability of the inner via hole including a conductive paste is improved so as to achieve higher density mounting, and also provide a method for manufacturing the same.

In order to achieve the above-mentioned objectives, the circuit board electrically insulating material of the present invention is a circuit board electrically insulating material in sheet form, insulating sheet, including a porous sheet; and a resin layer laminated to a surface of the porous sheet, wherein at least a central portion of the porous sheet is not impregnated with resin and the circuit board insulating material has a thickness sufficiently small for use in a circuit board. In other words, the circuit board electrically insulating material of the present invention includes a porous sheet provided with a semi-hardened resin layer on both surfaces or one surface. In the circuit board electrically insulating material, the pores of the porous sheet are hollow. Furthermore, the pores of the porous sheet of the present invention may be formed by continuous holes. Hereinafter, "at least a center of the porous sheet is not impregnated with resin" also is referred to as "pores of the porous sheet are hollow."

Next, the circuit board of the present invention includes a desired number of electrically insulating layers and wiring layers laminated alternately, and an inner via hole for securing an electrical connection between the wiring layers by compressing and hardening a conductive paste including a conductive particle and a resin; wherein the electrically insulating layer includes a porous sheet in which a resin layer is laminated to at least one surface, and at least a central portion of the porous sheet is not impregnated with a resin; a through hole penetrating the electrically insulating layer in the thickness direction of the electrically insulating layer is filled with a conductive paste including a conductive particle and a resin, and pores that are present inside the porous sheet are filled with the laminated resin; and the average hole diameter of the pores that are present inside the porous sheet is smaller than the average particle size of the conductive particle.

Next, a first method for manufacturing a double-sided circuit board of the present invention includes: providing a through hole at a desired position of a laminate in which mold release films are formed on both surfaces of the above-mentioned circuit board electrically insulating material; filling the through hole with a conductive paste; peeling off the mold release film from the laminate in which the through hole is filled with the conductive paste; superimposing metal foils on both surfaces of the circuit board electrically insulating material from which the mold release films have been peeled off to form a laminate; heating and pressing the laminate to allow hollow pores of the porous sheet to be filled with a resin and allow the metal foils to be adhered to the porous sheet while compressing and hardening the conductive paste filled in the through hole, thereby providing an inner via hole; and forming desired circuit patterns on the metal foil.

Next, a second method for manufacturing a double-sided circuit board of the present invention includes forming a laminate either by superimposing resin sheets on both surfaces of a porous sheet that is not completely impregnated with a resin, further superimposing the mold release films on both surfaces of the laminated resin sheet, and pressing thereof; or by forming a resin layer on one surface of a mold release film, further sandwiching a porous sheet that is not impregnated with a resin by the sides of the resin layer of the mold release films provided with the resin layers; and pressing thereof; providing a through hole in a desired position of the laminate provided with the mold release films; filling the through hole with a conductive paste; peeling off the mold release films from the laminate in which the through hole has been filled with the conductive paste; superimposing the metal foils on both surfaces of the laminate from which the mold release films have been peeled off; heating and pressing the laminate to allow hollow pores of the porous sheet to be filled with a resin and allow the metal foil to be adhered to the porous sheet, and compressing and hardening the conductive paste filled in the through hole, thereby providing an inner via hole; and forming desired circuit patterns on the metal foil.

Next, a third method for manufacturing a double-sided circuit board of the present invention includes providing a through hole at a desired position of a laminate in which mold release films are formed on both surfaces of a porous sheet that is not completely impregnated with a resin; filling the through hole with a conductive paste, and peeling off the mold release films from the laminate in which the through hole has been filled with the conductive paste; sandwiching the laminate from which the mold release films have been peeled off by transfer media, the transfer media being formed on a supporting base material by filling a resin in an exposed portion of the supporting base material at the side of the wiring layer provided on the supporting base material; and heating and pressing the laminate to allow hollow pores of the porous sheet to be filled with a resin and allow the wiring layer to be adhered to the porous sheet, and compressing and hardening the conductive paste filled in the through hole, thereby providing an inner via hole; and removing the supporting base material of the transfer medium from the heated and pressed laminate.

Next, a fourth method for manufacturing a double-sided circuit board of the present invention includes forming a resin layer at the side of a wiring layer of a transfer medium in which a wiring layer is provided on a supporting base material; sandwiching both surfaces of a porous sheet that is not completely impregnated with a resin between the transfer medium on which the resin layer is formed and a mold release film provided with a resin layer to form a laminate; forming a non-through hole at a desired position of the laminate from the side of the mold release film; filling the non-thorough hole with a conductive paste; peeling off the mold release film from the laminate in which the non-through hole has been filled with the conductive paste; superimposing a metal foil on the surface of the laminate from which the mold release film has been peeled off; heating and pressing the laminate to which the metal foil is superimposed to allow hollow pores of the porous sheet to be filled with a resin and allow the metal foils and the wiring layer of the transfer medium to be attached to the porous sheet, and compressing and hardening the conductive paste filled in the non-through hole, thereby providing an inner via hole; forming desired circuit patterns on the metal foil; and removing the supporting base material from the laminate in which the circuit patterns have been formed on the metal foil.

Next, a first method for manufacturing a multilayer circuit board of the present invention repeats the following steps once or more: providing a through hole at a desired position of the laminate in which mold release films are formed on both surfaces of the above-mentioned circuit board electrically insulating materials; and filling the through hole with a conductive paste; peeling off the mold release films from the laminate in which the through hole has been filled with the conductive paste; superimposing a desired number of the circuit board electrically insulating material from which the mold release films have been peeled off and the circuit board provided with two or more of wiring layers alternately so that the circuit board electrically insulating material becomes the outermost layer, and furthermore superimposing metal foils on the surface thereof to form a laminate; heating and pressing the laminate to allow hollow pores of the porous sheet to be filled with a resin and allow the metal foil and the circuit board to be adhered to the porous sheet, and compressing and hardening the conductive paste filled in the through hole, thereby providing an inner via hole; and forming desired circuit patterns on the metal foil.

Next, a second method for manufacturing a multilayer circuit board of the present invention repeats the following steps once or more: forming a laminate either by superimposing resin sheets on both surfaces of a porous sheet that is not completely impregnated with a resin, further superimposing the mold release films on both surfaces of the laminated resin sheet, and pressing thereof; or by forming a resin layer on one surface of the mold release film, sandwiching a porous sheet that is not completely impregnated with the resin between the sides of the resin layer of the mold release film provided with the resin layer, and pressing thereof; providing a through hole at a desired position of the laminate provided with the mold release films, filling the through hole with the conductive paste, and peeling off the mold release films from the laminate in which the through hole has been filled with the conductive paste; superimposing a desired number of the laminate from which the mold release films have been peeled off and the circuit board electrically insulating material provided with two or more of the wiring layers alternately so that the circuit board electrically insulating material becomes the outermost layer, and furthermore superimposing a metal foil; heating and pressing the laminate to allow hollow pores of the porous sheet to be filled with a resin and allow the metal foil and the circuit board to be adhered to the porous sheet, and compressing and hardening the conductive paste filled in the through hole, thereby providing an inner via hole; and forming desired circuit patterns on the metal foil.

Next, a third method for manufacturing a multilayer circuit board of the present invention repeats the following steps once or more: forming a resin layer on at least one surface of the circuit board provided with two or more wiring layers; superimposing a porous sheet that is not completely impregnated with a resin at the side of the resin layer of the circuit board; and furthermore superimposing the mold release film provided with the resin layer on one surface onto the porous sheet; forming a non-through hole at a desired position of the laminate from the side of the mold release film; filling the non-through hole with the conductive paste; and peeling off the mold release film from the laminate in which the non-through hole has been filled with the conductive paste; superimposing metal foils on the surfaces of the laminate from which the mold release films have been peeled off; heating and pressing the laminate to allow hollow pores of the porous sheet to be filled with a resin and allow the metal foil and the circuit board to be adhered to the porous sheet, and compressing and hardening the conductive paste filled in the through hole, thereby providing an inner via hole; and forming desired circuit patterns on the metal foil.

As mentioned above, with the circuit board electrically insulating material, circuit boards or the methods for manufacturing a circuit board of the present invention, it is possible to make the electrically insulating layer of the circuit board which secures the electrically connection with the inner via hole including a conductive paste to be homogenized and ultra thin and the reliability of the via connection to be higher. Therefore, the present invention can provide a circuit board that is extremely suitable for high density mounting.

BRIEF DESCRIPTION OF THE DRAWINGS

FIG. 3A is a cross-sectional view schematically showing an inner via hole before press molding; and FIG. 3B is a cross-sectional view schematically showing an inner via hole after press molding.

FIGS. 5A to 5B are cross-sectional views schematically showing the steps of a method for manufacturing a laminate according to a fourth embodiment of the present invention.

FIGS. 9A to 9H are cross-sectional views schematically showing a method for manufacturing a double-sided circuit board according to a ninth embodiment of the present invention.

FIG. 10A is a cross-sectional view schematically showing an inner via hole before press molding; and FIG. 10B is a cross-sectional view schematically showing an inner via hole after press molding.

DETAILED DESCRIPTION OF THE INVENTION

Figure 1:
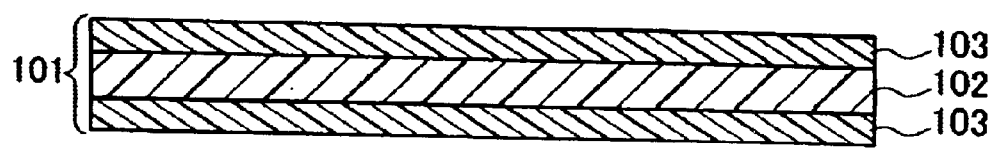
FIG. 1 is a cross-sectional view schematically showing a circuit board electrically insulating material according to a first embodiment of the present invention.

In a porous sheet used for a circuit board electrically insulating material of the present invention, all the pores are not necessarily hollow. It is preferable that the ratio of pores (the porosity) is 10 vol. % or more with respect to the entire volume of the circuit board electrically insulating material. More preferably, the porosity is in the range from 10 vol. % to 45 vol. %.

The average hole diameter of the pores is preferably in the range from 0.1 $\mu$m to 10 $\mu$m. The pores can be measured by mercury porosimetry with a mercury porosimeter "Autopore 3" produced by Micrometrictics, a mercury pressure process, and the observation of pores in the cross section by a scanning electron microscope.

Furthermore, on at least one surface of the porous sheet, a resin layer is laminated, a part of the porous sheet may be impregnated with the resin. The preferable ratio of the part that is not impregnated with the resin is 50% to 90% in the thickness direction.

It is preferable that the thickness of the porous sheet is in the range from 5 $\mu$m to 100 $\mu$m.

It is preferable that the porous sheet is at least one selected from an organic material and ceramics.

Furthermore, it is preferable that the organic material is at least one material selected from polytetrafluoroethylene (PTFE), polyimide, all aromatic polyamide, and all aromatic polyester. Herein, for example, a material such as PET that has an alkyl group in the chain is not included in the all aromatic polyester.

Furthermore, it is preferable that the porous sheet is a non-woven fabric containing a synthetic fiber as a main component.

Furthermore, in the first to third methods for manufacturing a multilayer circuit board, it is preferable that the conductive paste contains a conductive particle and a resin as a main component and the average hole diameter of the pores of the porous sheet is smaller than the average particle size of the conductive particle.

In the circuit board electrically insulating material of the present invention, all of the pores of the porous sheet are not necessarily hollow. The lower limit of the ratio of pores (the porosity) is 10 vol. % with respect to the entire volume of the circuit board electrically insulating material. However, the porosity is not limited to this alone as long as the porosity can secure a suitable compressive rate for securing the satisfactory connection reliability of the inner via holes when the circuit board electrically insulating material is used for a circuit board in which the interlayer connection of the inner via hole with the use of a conductive paste. Furthermore, an upper limit of the hole diameter of the pores may be 10 $\mu$m. However, the hole diameter is not limited to this alone, especially if the hole diameter is smaller than the particle size of the conductive particle when it is used for the circuit board in which the inner via hole including a conductive paste is used for interlayer connection. By the below mentioned filter effect, it is possible to form an inner via hole having high connection reliability. Furthermore, it is preferable that the porous sheet of the circuit board electrically insulating material of the present invention includes an organic material or ceramics. The organic material is suitable in the case where the circuit board is required to have a light weight, low dielectric constant and flexibility. Ceramics are suitable in the case where the circuit board is required to have a low thermal expansion, high thermal resistance and high rigidity. Furthermore, it is preferable that the organic porous sheet is selected from the group consisting of polytetrafluoroethylene (PTFE), polyimide, all aromatic polyamide, and all aromatic polyester. These materials are excellent in thermal stability and an electrically insulating property and has a low dielectric property, and thus, they are suitable for an electrically insulating layer of the circuit board. Furthermore, the porous sheet of the circuit board electrically insulating material may be a non-woven fabric containing an organic fiber as a main component. In this case, it is possible to radically improve the connection reliability of the inner via holes as compared with the conventional circuit board (which uses a non-woven fabric for a reinforcing material) in which an inner via hole including a conductive paste. Furthermore, the resin layer of the circuit board electrically insulating material of the present invention is required to be a resin that is melt-flown and hardened when the circuit board is molded by heating and pressing (mainly vacuum heat press molding), that is, a semi-hardened resin. In particular, a thermosetting resin such as an epoxy resin, a phenol resin, a polyimide resin etc. or a denatured thermosetting resin is preferred.

Furthermore, it is preferable that the conductive paste contains a conductive particle and a resin as a main component and that the average hole diameter of the pores of the porous sheet is smaller than the average particle size of the conductive particle. Herein, "main component" denotes a component occupying 60 weight % or more with respect to the whole. The same is true in the other cases of the present invention.

Furthermore, it is preferable that the conductive paste includes the conductive particle in the range from 70 to 95 weight % and the resin is in the range from 5 to 30 weight %.

Furthermore, the circuit board electrically insulating material of the present invention is explained in more detail by way of Embodiments with reference to drawings.

[First Embodiment]

Figure 10A:
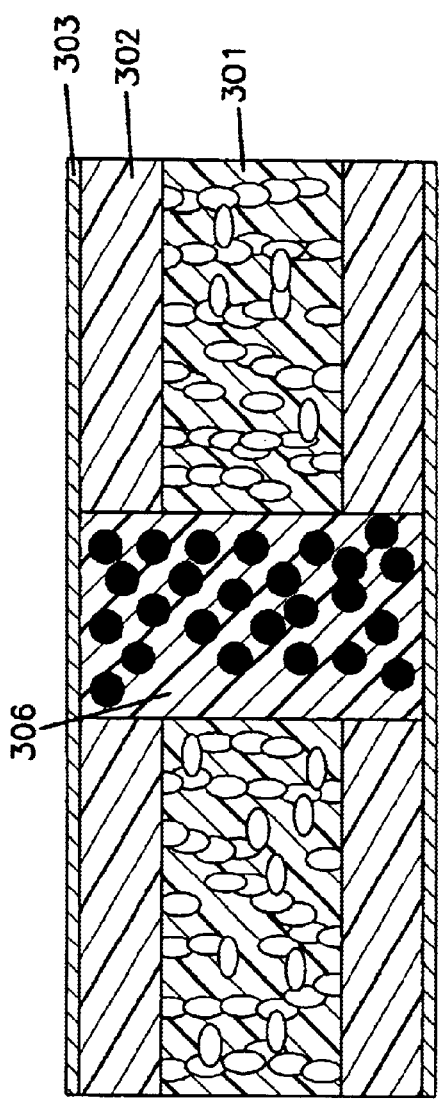
FIGS. 10A and 10B are cross-sectional views schematically showing a mechanism of the via connection of the present invention.
Figure 10B:
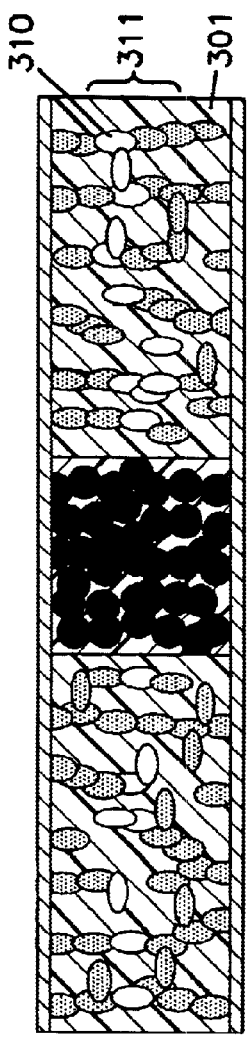

FIG. 1 is a cross-sectional view schematically showing a circuit board electrically insulating material according to a first embodiment of the present invention. This circuit board electrically insulating material 101 includes a porous sheet 102 and semi-hardened resin layers 103. The semi-hardened resin layers are formed on both surfaces of the porous sheet 102. Pores of the porous sheet 102 are not completely filled with a resin. See also FIGS. 10A and 10B. FIG. 10 B shows the pores not impregnated 310 after press molding. This creates a central portion 311 of the porous sheet that is not impregnated with resin.

In the configuration of the first embodiment, when the circuit board electrically insulating material 101 of the present invention is heated and pressed, the melt flow of the resin layer 103 occurs due to the heat and the resin of the resin layer is allowed to fill in the pores of the porous sheet 102. In other words, since the resin layer 103 enters the pores of the porous sheet 102, the electrically insulating material 101 can be changed significantly in the thickness, i.e., the electrically insulating material 101 can be compressed extremely excellently due to heat and pressure. Therefore, when the circuit board electrically insulating material 101 is used for a circuit board in which interlayer connection is performed with an inner via hole including a conductive paste, the conductive paste is compressed quite sufficiently, thus enhancing the reliability of the via connection.

Conventionally, in order to secure the compressive performance, conventionally, a non-woven fabric that is a reinforcing material also is required to have a compressive performance to some extent. In the configuration of the present invention, since the compressive performance can be secured by the fact that the resin layer enters the inside of the porous sheet, the reinforcing material in not necessarily compressed. Therefore, since a non-woven fabric that hardly has a compressive performance, in order words, a non-woven fabric having higher density (i.e., a higher bulk density) can be used, an electrically insulating material suitable for a circuit board for high density mounting can be provided. Furthermore, in the configuration of the present invention, an inorganic porous sheet having no compressive performance can be used as a reinforcing material for the circuit board electrically insulating material having a compressive performance.

Furthermore, by using a material having micro pores, preferably pores having a hole diameter of 10 μm or less, for the porous sheet 102, it is possible to make the electrically insulating layer to be homogenized and ultra-thin, and to make a connection by an inner via hole including a conductive paste more reliable easily. Thus, it is possible to provide a circuit board suitable for high density mounting.

The following is an explanation of a circuit board of the present invention. The circuit board of the present invention has a layer for securing the electrical connection between the wiring layers by providing an inner via hole by compressing and hardening a conductive paste including a conductive particle and a resin. The electrically insulating layer provided with the inner via hole includes a composite material made of a porous sheet and a resin.

Furthermore, the hole diameter of the pores of the porous sheet may be smaller than the particle size of the conductive particles. Furthermore, the electrically insulating layer with the inner via hole may be provided in one process, i.e., by carrying out a process of filling the resin into the pore of the porous sheet and a process of compressing and hardening the conductive paste at the same time. Furthermore, it is preferable that the porous sheet of the circuit board of the present invention has a hole diameter of 10 μm as an upper limit and is made of an organic sheet or ceramic sheet. The organic sheet is suitable for achieving light weight, low dielectric constant, and flexibility of the circuit board. The ceramic sheet is suitable for achieving low thermal expansion, high heat resistance, and high rigidity of the circuit board. Furthermore, it is preferable that the organic porous sheet is selected from the group consisting of polytetrafluoroethylene (PTFE), polyimide, all aromatic polyamide, and all aromatic polyester. Since they are excellent in the thermal stability and insulation performance, and low dielectric constant, they are suitable for an electrically insulating layer of the circuit board. Furthermore, it is preferable that the conductive paste usable for the circuit board of the present invention includes a conductive particle selected from gold, silver, copper and palladium, or an alloy thereof, and a thermosetting resin, specifically, an epoxy resin. Hereinafter, the circuit board of the present invention is described more specifically by way of embodiments with reference to drawings.

[Second Embodiment]

Figure 2:
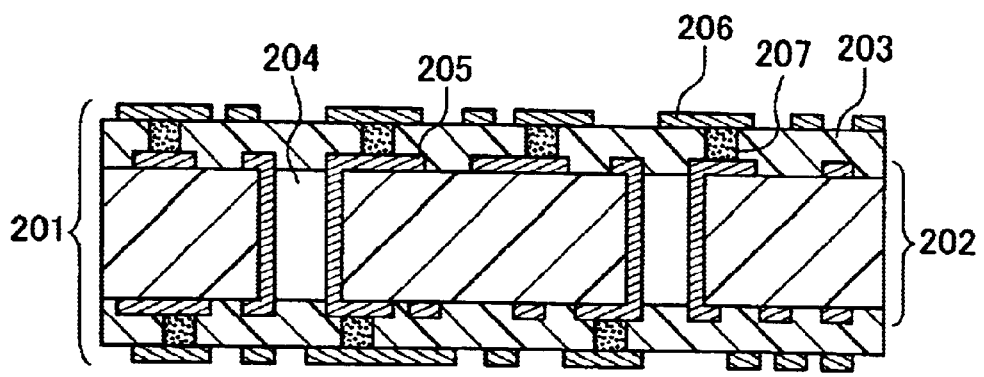
FIG. 2 is a cross-sectional view schematically showing a circuit board according to a second embodiment of the present invention.

FIG. 2 is a cross-sectional view schematically showing a configuration of a circuit board according to a second embodiment of the present invention. A circuit board 201 is a four-layered circuit board including a double-sided circuit board 202 and electrically insulating layers 203, formed by filling a resin in pores of the porous sheet, which are formed on both surfaces of the double-sided circuit board 202. In the four-layered circuit board, the interlayer electrical connection between inner wiring layer 205 is secured by the through hole 204 and the interlayer electrical connection between the inner wiring layer 205, and an outer wiring layer 206 is secured by an inner via hole 207 filled with a conductive paste. According to this configuration, it is possible to provide a circuit board extremely suitable for high density mounting because an IVH structure homogeneous and thin electrically insulating layer is provided at the outermost layer, and the inner via holes of the electrically insulating layer can be made small easily.

Figures 3A, 3B:
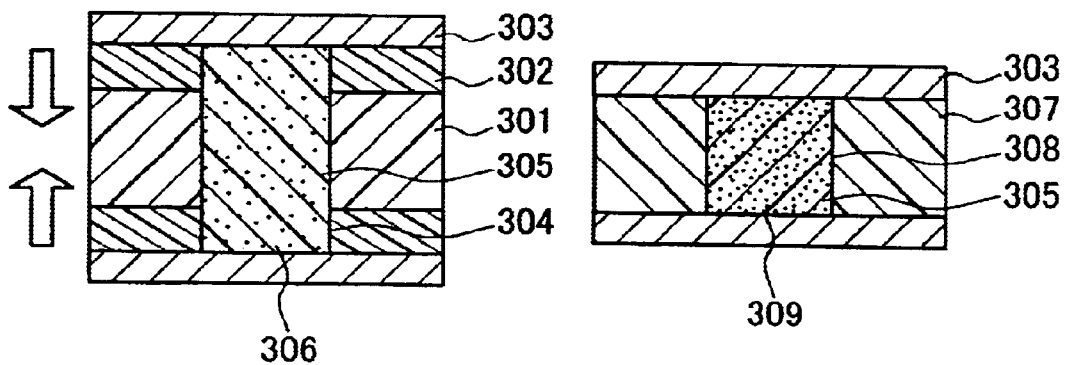
FIGS. 3A–3B are cross-sectional views schematically showing a mechanism of the via connection of the present invention.
Figure 4A:
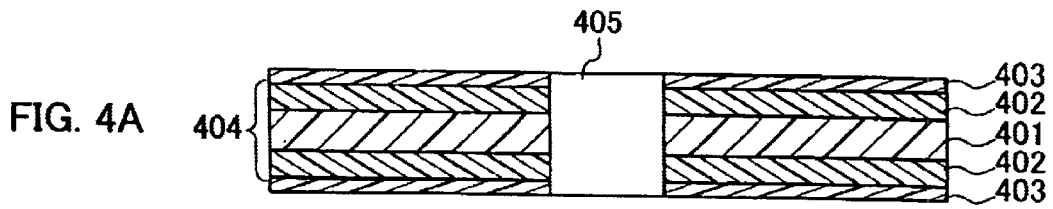
FIGS. 4A to 4F are cross-sectional views schematically showing the steps of a method for manufacturing a double-sided circuit board according to a third embodiment of the present invention.
Figure 4B:
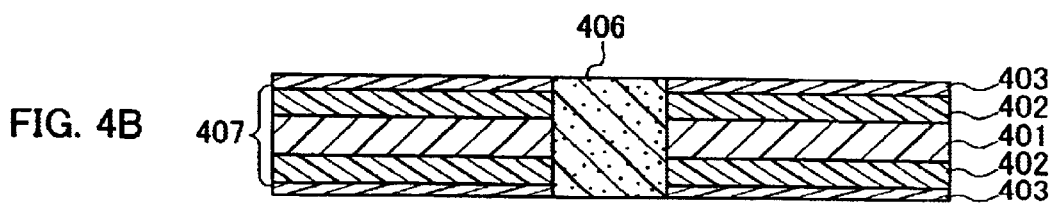
Figure 4C:
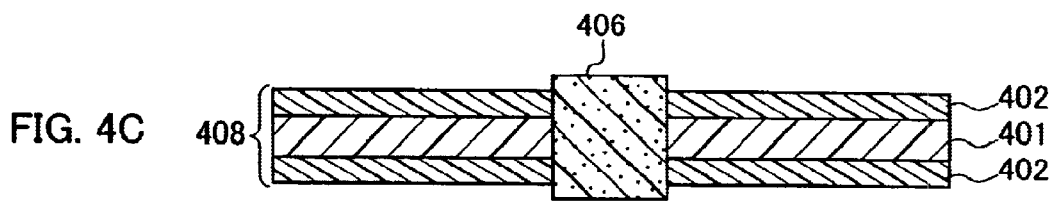
Figure 4D:
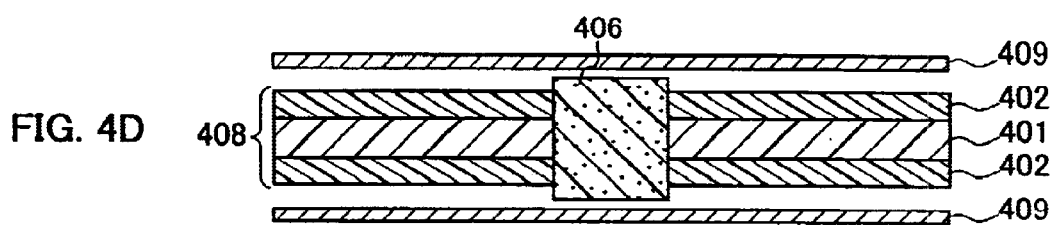
Figure 4E:
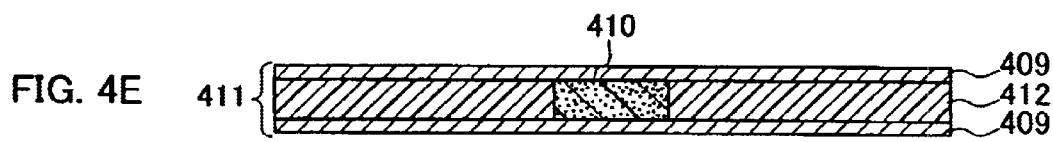
Figure 4F:
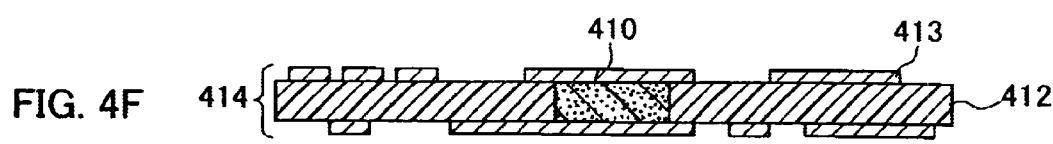

In the second embodiment, the inner via hole 207 is described in more detail with reference to FIGS. 3A and 3B. FIG. 3A is a cross-sectional view schematically showing an inner via hole before the circuit board is press molded. The semi-hardened resin layers 302 are provided on both surfaces of the porous sheet 301, and furthermore, the wiring layers 303 are provided on the surfaces of both resin layers 302, thereby forming a laminate. A through hole 304 provided on the laminate is filled with a conductive paste including a conductive particle 305 and a thermosetting resin 306. By heating and pressing this laminate, the structure is changed from the structure of FIG. 3A into the structure of FIG. 3B. FIG. 3B corresponds to the inner via hole 207 of the second embodiment. In this structure, the electrically insulating layer 307 formed by filling the pores of the porous sheet with the resin (resin of the resin layer 302) has an inner via hole 308 provided by compressing and hardening the conductive paste including the conductive particle 305 and the thermosetting resin 306. In the embodiment of FIG. 3A, the hole diameter of the pores of the porous sheet 301 may be smaller than the average particle size of the conductive particle 305. Therefore, when the conductive paste is subjected to heat and pressure, the conductive particle 305 in the conductive paste remains in the through hole 304 perfectly, and an excessive paste resin is ejected to the electrically insulating layer 301. Thus, a filter effect can be obtained. As a result, the F value (weight ratio of the conductive particles in the paste) of the inner via hole 308 after being molded can be increased radically, and the inner via hole 308 can have a highly reliable connection. In the heating and pressing molding shown in FIGS. 3A to 3B, the inner via hole 308 is compressed sufficiently because the conductive paste undergoes large compression effect and because the resin of the resin layer 302 is filled in the pores of the porous sheet 301. Furthermore, in FIG. 3A, when the through hole 304 is filled with the conductive paste, the resin in the paste can be ejected to the pores in advance by a capillary phenomenon. Therefore, even in a stage before molding, the F-value of the paste filled in the through hole 304 can be increased. The above-mentioned function can be provided in the case where the pores of the porous sheet are hollow as shown in FIG. 3A, and thus the inner via hole 308 can have an extremely high connection reliability.

Next, a method for manufacturing a double-sided circuit board of the present invention is described. The method for manufacturing the double-sided circuit board of the present invention employs an inter-layer connecting technique using an inner via hole including a conductive paste. The method is characterized by carrying out compressing and hardening a conductive paste; filling a resin in the pores of the porous sheet; and molding a circuit board in one step. This method makes it possible to compress the conductive paste sufficiently. Furthermore, since resin in the paste can be ejected to the pores of the porous sheet by a capillary phenomenon when the through holes or non-through holes are filled with the conductive paste, the F value of the conductive paste can be increased in advance. Therefore, it is preferable that the hole diameter of the pores of the porous sheet is smaller than the particle size of the conductive particle. It is more preferable that the upper limit of the hole diameter is 10 $\mu$m. Moreover, this effect can be enhanced by filling the conductive paste in a vacuum. As mentioned above, by the method for manufacturing the double-sided circuit board of the present invention, it is possible to provide a double-sided circuit board capable of making the electrically insulating layer to be homogenized and ultra-thin and making the connection of the inner via hole including a conductive paste to be more reliable. Moreover, the porous sheet may be a non-woven fabric containing an organic fiber as a main component. In this case, it is possible to provide a circuit board having more reliable connection of the inner via hole and dimensional stability as compared with those of a conventional circuit board using an aramid prepreg. Furthermore, it is preferable in the double-sided circuit board of the present invention that the conductive paste contains a conductive paste selected from gold, silver, copper and palladium or an alloy thereof and a thermosetting resin, such as an epoxy resin etc. Hereinafter, the method for manufacturing double-sided circuit boards of the first to fourth embodiments are described with reference to drawings.

[Third Embodiment]

A method for manufacturing a first double-sided circuit board of the present invention is described. FIGS. 4A to 4F are cross-sectional views schematically showing a method for manufacturing a double-sided circuit board according to a third embodiment of the present invention. The method for manufacturing the first double-sided circuit board includes steps of: providing a through hole 405 on a laminate 404 in which mold release films 403 are formed on both surfaces of the circuit board electrically insulating material of the present invention in which semi-hardened resin layers 402 are formed on both surfaces of a porous sheet 401 (see FIG. 4A); filling the through hole with a conductive paste 406 (see FIG. 4B); peeling off only the mold release films 403 from the laminate 407 in which the through hole has been filled with the conductive paste (see FIG. 4C); superimposing metal foils 409 on both surfaces of the circuit board electrically insulating material 408 from which the mold release films have been peeled off (see FIG. 4D); heating and pressing the laminate of FIG. 4D to allow hollow pores of the porous sheet to be filled with a resin and allow the metal foils to be adhered to the porous sheet, and further compressing and hardening the conductive paste to form an inner via hole 410 (see FIG. 4E); and forming desired circuit patterns 413 on the metal foil (see FIG. 4F).

[Fourth Embodiment]

A method for manufacturing a second double-sided circuit board of the present invention is described. FIGS. 5A to 5B are cross-sectional views schematically showing a method for manufacturing a double-sided circuit board according to a third embodiment of the present invention. The method for manufacturing the double-sided circuit board does not necessarily use a circuit board electrically insulating material of the present invention. The method for manufacturing the second double-sided circuit board includes either a step of superimposing semi-hardened resin sheets 502 on both surfaces of the porous sheet 501 having hollow pores, and further superimposing the mold release films 503 on the surface of the both resin sheets 502, and pressing thereof to form a laminate 504 (see FIG. 5A); or the step of forming a semi-hardened resin layer 505 on one surface of the mold release film 503, and then sandwiching the porous sheet 501 having hollow pores between the resin layer sides of the mold release films, and then pressing thereof to form a laminate 504 (see FIG. 5B). By employing any one of the above-mentioned steps, the laminate that is the same as the laminate 404 in FIG. 4A can be obtained. The subsequent steps including providing a through hole to the formation of the circuit patterns are the same as in the third Embodiment.

[Fifth Embodiment]

Figure 6A:
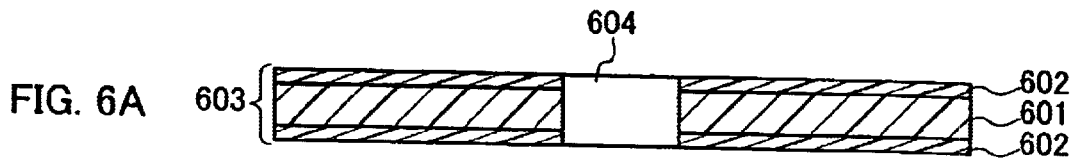
FIGS. 6A to 6F are cross-sectional views schematically showing a method for manufacturing a double-sided circuit board according to a fifth embodiment of the present invention.
Figure 6B:
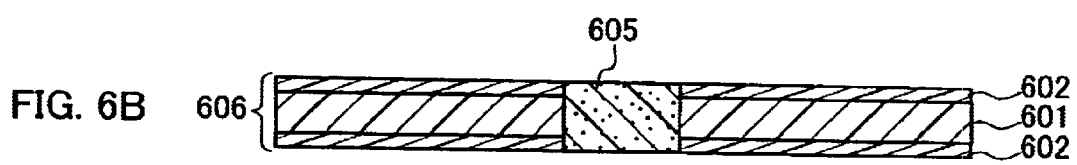
Figure 6C:
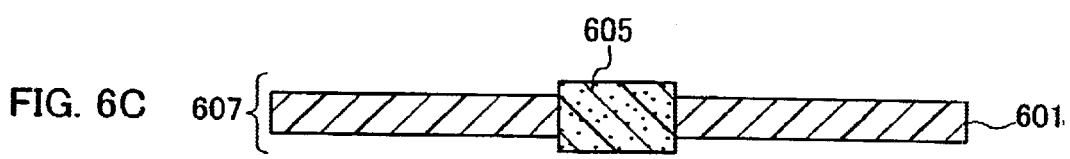
Figure 6D:
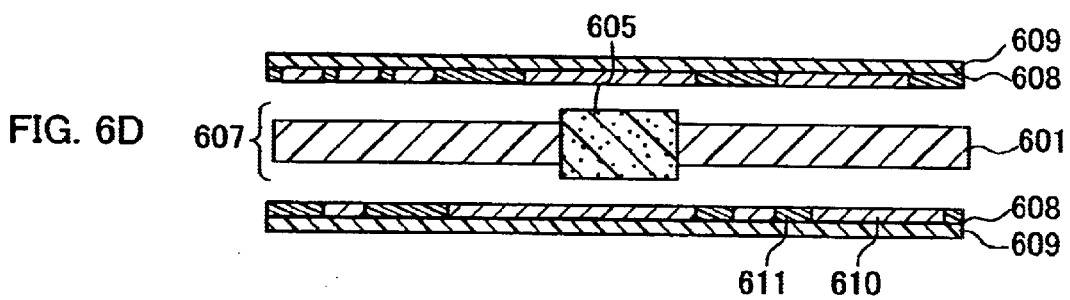
Figure 6E:
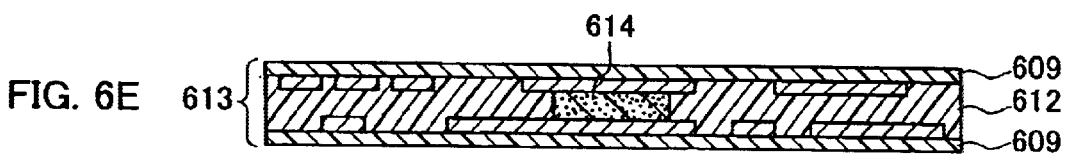
Figure 6F:
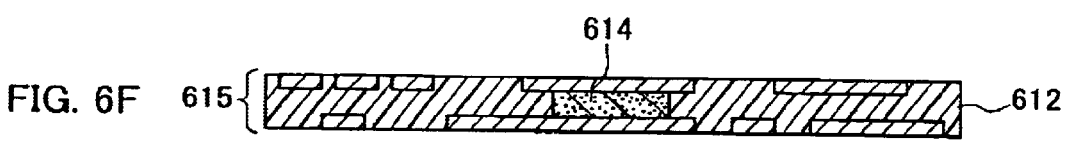

A method for manufacturing a third double-sided circuit board of the present invention is described. FIGS. 6A to 6F are cross-sectional views schematically showing a method for manufacturing a double-sided circuit board according to a fifth embodiment of the present invention. The method for manufacturing the third double-sided circuit board includes steps of: providing a through hole 604 on a predetermined position of a laminate 603 in which mold release films 602 are formed on both surfaces of a porous sheet 601 having hollow pores (see FIG. 6A); filling the through hole with a conductive paste 605 (see FIG. 6B); peeling off the mold release films 602 from the laminate 606 in which the through hole has been filled with the conductive paste (FIG. 6C); sandwiching the laminated 607 from which the mold release films have been peeled off by transfer media 608 formed on support base materials 609 (FIG. 6D); heating and pressing the laminate of FIG. 6D to allow hollow pores of the porous sheet to be filled with the resin provided for the transfer media and allow the wiring layer to be adhered to the porous sheet, and further compressing and hardening the conductive paste that has been filled in the through hole to form an inner via hole 614 (see FIG. 6E); and removing the support base materials 609 of the transfer medium from the molded laminate 613 (see FIG. 6F). According to this embodiment, as shown in FIGS. 6D to 6F, since the wiring layers having a predetermined circuit patterns are transferred, it is possible to provide a double-sided circuit board excellent in coplanarity (flatness) and extremely suitable for surface mounting. Furthermore, in this embodiment, the conductive paste is compressed with the convex wiring layer, so that a more compressed inner via hole can be obtained, and it is possible to provide a circuit board having a highly reliable connection. In the step shown in FIG. 6A, a one-side adhesive film may be used for the mold release film 602. For forming the semi-hardened resin layer 611 on the transfer medium 608, a printing method such as a screen printing, etc. may be used.

[Sixth Embodiment]

Figure 7A:
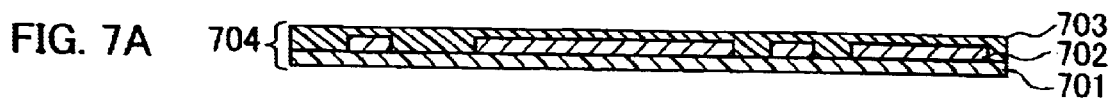
FIGS. 7A to 7I are cross-sectional views schematically showing a method for manufacturing a double-sided circuit board according to a sixth embodiment of the present invention.
Figure 7B:
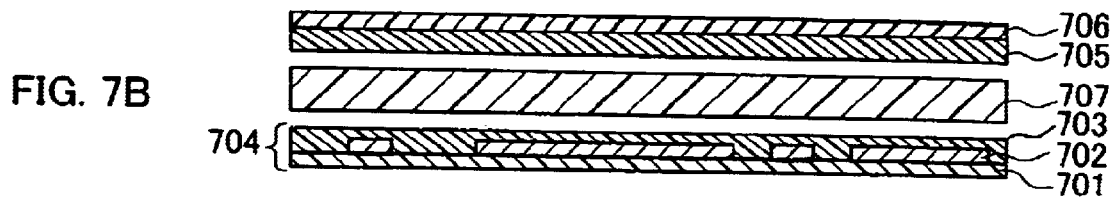
Figure 7C:
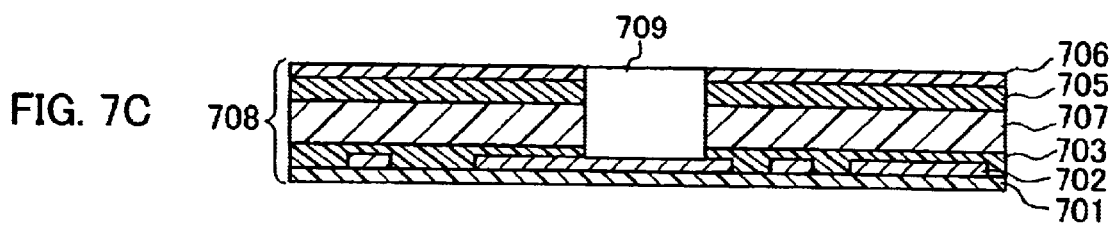
Figure 7D:
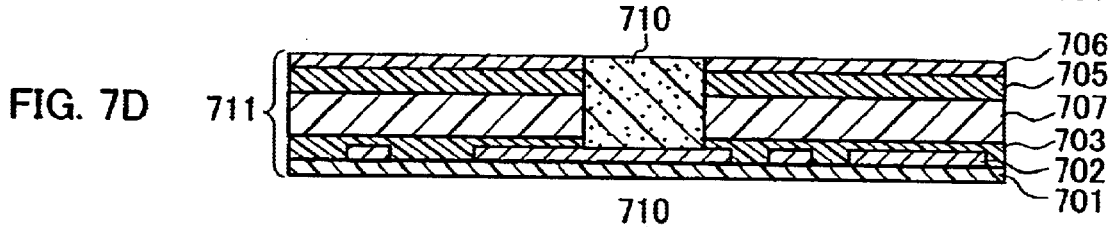
Figure 7E:
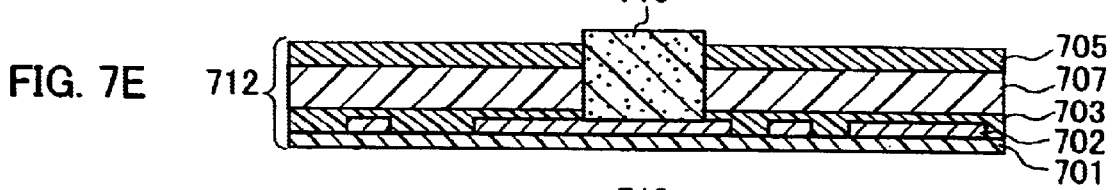
Figure 7F:
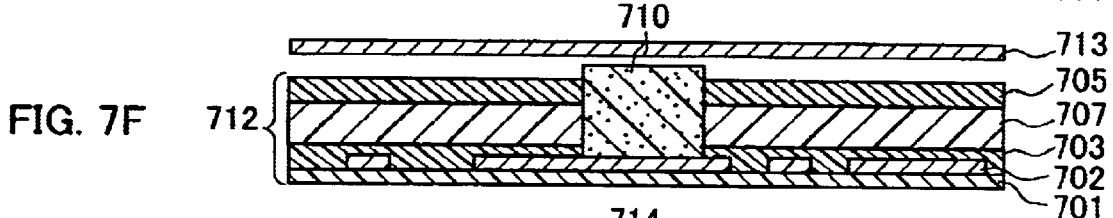
Figure 7G:
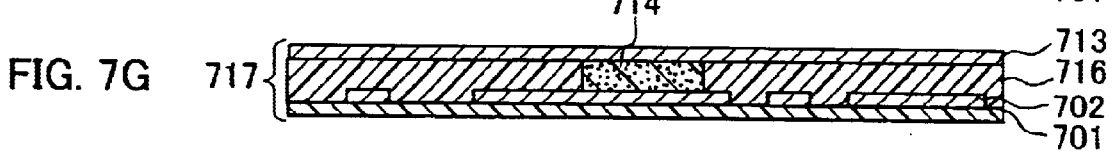
Figure 7H:
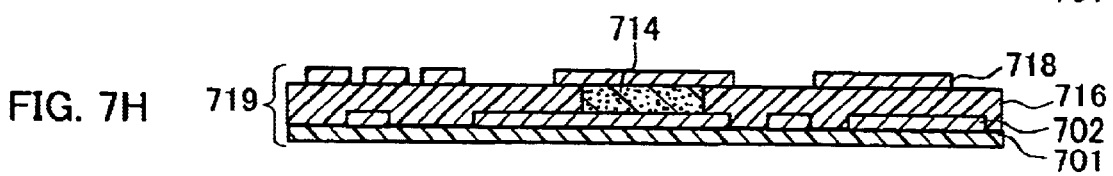
Figure 7I:
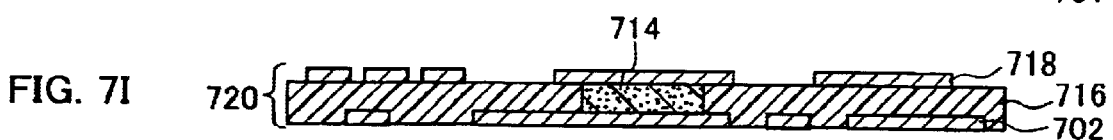

A method for manufacturing a fourth double-sided circuit board of the present invention is described. FIGS. 7A to 7I are cross-sectional views schematically showing a method for manufacturing a double-sided circuit board according to a sixth embodiment of the present invention. The method for manufacturing the fourth double-sided circuit board includes at least forming a semi-hardened resin layer 703 on the wiring layer side of a transfer medium laminate in which a wiring layer 702 is formed on a support base material 701 (see FIG. 7A); sandwiching a porous sheet 707 having hollow pores between a mold release film 706 provided with a transfer medium 704 and a semi-hardened resin 705 (see FIG. 7B); providing a non-through hole 709 from the side of the mold release film of the laminate 708 (see FIG. 7C); filling the non-through hole with a conductive paste 710 (see FIG. 7D); peeling off only the mold release films 706 from the laminate 711 filled with the conductive paste (see FIG. 7E); superimposing a metal foil 713 on a laminate 712 from which the mold release films is peeled off (see FIG. 7F); heating and pressing the laminate of the FIG. 7F to allow hollow pores of the porous sheet to be filled with a resin and allow the metal foil to be adhered to the porous sheet and further compressing and hardening the conductive paste to form an inner via hole 714 (see FIG. 7G); forming a predetermined circuit pattern 718 on the metal foil of the molded laminate (see FIG. 7H); and removing only the support base material 701 from the laminate of FIG. 7H (see FIG. 7I). According to this embodiment, as shown in FIG. 7C, since the non-through hole 709 is provided while reading out the circuit patterns, it is not necessary to carry out the positioning of the circuit patterns and the inner via hole when the laminate is formed. Thus, the method for manufacturing the double-sided circuit board of this embodiment is extremely excellent in allowing the circuit pattern to be finer. Furthermore, although the manufacturing process is carried out on one side in this embodiment, similar to the fifth embodiment, a conductive paste is compressed with the convex wiring layer 702. Therefore, it is possible to obtain a more compressed inner via hole, and to provide a circuit board having a highly reliable connection. Moreover, in the step of FIG. 7A, the resin layer 703 may be printed by a spin coating method, a printing method, or the like.

Next, a method for manufacturing multilayer circuit board according to the present invention is described. The method for manufacturing the multilayer circuit board of the present invention is a method for manufacturing the multilayer circuit board using an interlayer connecting technique with the inner via hole including a conductive paste. In the formation of the layer having the inner via hole including a conductive paste, a compressing and hardening of the conductive paste, filling pores of the porous sheet with a resin, and forming the multi-layer structure are carried out in one step. Thereby, the conductive paste can be compressed sufficiently. Furthermore, in the step of filling a through hole or a non-through hole with the conductive paste, a resin in the paste is ejected to the pores of the porous sheet by a capillary phenomenon, and the F value of the conductive paste can be increased in advance. Therefore, it is preferable that the hole diameter of the pores of the porous sheet is smaller than the particle size of the conductive particle. Preferably, the upper limit of the hole diameter is set to be 10 $\mu$m. The above-mentioned effect is enhanced when filling of the conductive paste is carried out in a vacuum. As mentioned above, according to the method for manufacturing a multilayer circuit board of the present invention, it is possible to provide a multilayer circuit board capable of making the electrically insulating layer to be homogenized and ultra-thin and easily making the connection by an inner via hole including a conductive paste to be more reliable. Moreover, the porous sheet may be a non-woven fabric containing an organic fiber as a main component. In this case, it is possible to provide a circuit board having more reliable connection of the inner via hole and dimensional stability as compared with those of a conventional circuit board using an aramid prepreg. Furthermore, it is preferable in the multilayer circuit board of the present invention that the conductive paste contains a conductive material selected from gold, silver, copper and palladium or, an alloy thereof, and thermosetting resin such as an epoxy resin as a main component. Hereinafter, the method for manufacturing the multilayer circuit boards of the first to fourth embodiments is described with reference to the drawings.

[Seventh Embodiment]

Figure 8A:
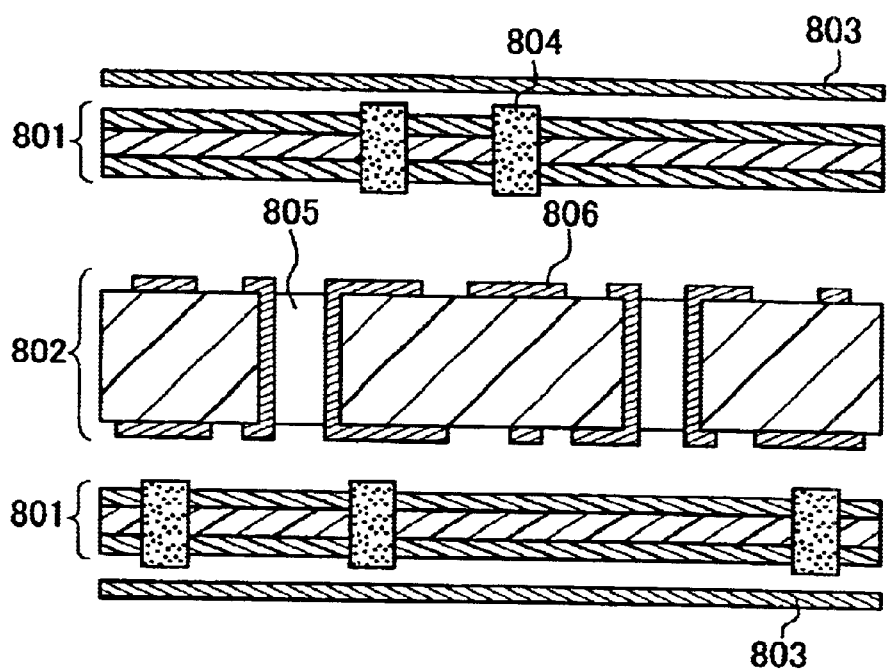
FIGS. 8A to 8C are cross-sectional views schematically showing a method for manufacturing a double-sided circuit board according to a seventh embodiment of the present invention.
Figure 8B:
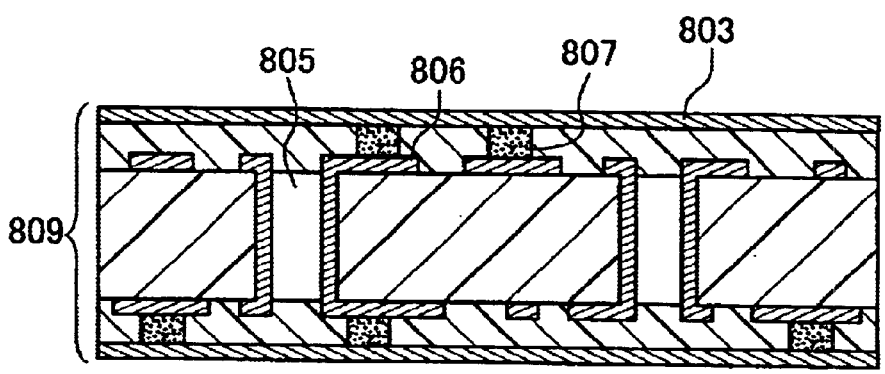
Figure 8C:
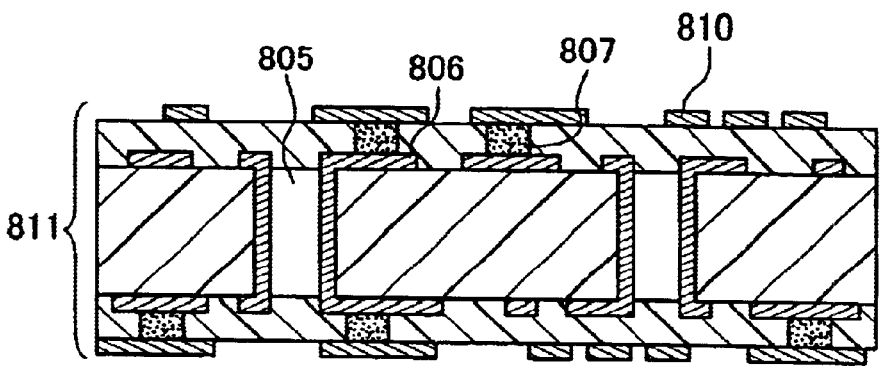

A method for manufacturing a first method for manufacturing a multilayer double-sided circuit board of the present invention is described. FIGS. 8A to 8C are cross-sectional views schematically showing a method for manufacturing a multilayer circuit board according to a seventh embodiment of the present invention. The method for manufacturing the first double-sided circuit carries out at least the steps of: superimposing a laminate 801 from which a mold release film has been peeled off and a circuit board 802 alternately, and further superimposing a metal foil 803 thereon (see FIG. 8A); heating and pressing the laminate to allow hollow pores of the porous sheet to be filled with the resin and allow the metal foil 803 to be adhered to the circuit board 802, and further compressing and hardening the conductive paste 804 to form an inner via hole 807 (see FIG. 8B), and forming circuit patterns 810 on the metal foil (see FIG. 8C). The above-mentioned steps are repeated once or more. By repeating a series of the above-mentioned steps, it is possible to provide a multi-layer circuit board in which many layers are laminated. The laminate 801 corresponds to the laminate 407 of FIG. 4B, which can be manufactured by the step explained in the method for manufacturing the first double-sided circuit board of the present invention. According to this embodiment, since a fine pattern layer can be formed on the outermost layer easily, it is possible to provide a multilayer circuit board for high density mounting. Moreover, the circuit board 802 of this embodiment uses a circuit board having a through hole, however, the circuit board 802 of the present invention may have other configuration.

[Eighth Embodiment]

This embodiment is the same as in the seventh embodiment except that as the laminate 801 of FIG. 8A, the laminate 504 described in the method for manufacturing the second double-sided circuit board (FIG. 5B) is used, and it possible to provide a multilayer circuit board for high density mounting.

[Ninth Embodiment]

The method for manufacturing a third multilayer circuit board of the present invention is described. FIGS. 9A to 9H are cross-sectional views schematically showing a method for manufacturing the multilayer circuit board of the ninth embodiment. The method of this embodiment includes the steps of: forming a semi-hardened resin layer 902 on one surface of a circuit board 901 provided with a support base material 907, an inner wiring layer 906 and an inner via hole 904 including a conductive paste to form a circuit board 903 (see FIG. 9A); superimposing a porous sheet 908 having hollow pores at the side of the resin layer, and furthermore superimposing a mold release film 910 provided with a semi-hardened resin layer 909 to form a laminate 911 (see FIG. 9B); providing a non-through hole 912 from the side of the mold release film of the laminate 911 (see FIG. 9C); filling the non-through hole with a conductive paste 913 (see FIG. 9D); peeling off only the mold release film 910 from the laminate 911 in which the non-through hole has been filled with the conductive paste (see FIG. 9E); superimposing a metal foil 916 on the laminate 915 from which the mold release film has been peeled off (see FIG. 9F); heating and pressing the laminate to allow hollow pores of the porous sheet to be filled with a resin and allow the metal foil to be adhered to the porous sheet, and further compressing and hardening the conductive paste to form an inner via hole 917 (see FIG. 9G); and forming circuit patterns 920 on the metal foil of a molded laminate 919 (see FIG. 9H). The above-mentioned steps are repeated once or more. By repeating the above-mentioned series of steps and finally removing the support base material 907, a circuit board having a multilayer structure and fine patterns can be provided. Moreover, in the step of FIG. 9A, the resin layer 902 may be formed by the spin coating method, the printing method, or the like. Furthermore, the circuit board 901 may use the circuit board of the sixth embodiment (numeral 719 in FIG. 7H). However, a circuit board having another configuration may be used, for example, a circuit board having a through hole, or a circuit board in which all the layers have an IVH structure. Furthermore, there is no limitation as to the number of layers.

As mentioned above, in the circuit board using an interlayer connecting technique with the inner via hole including a conductive paste, by using the circuit board electrically insulating material of the present invention, it is possible to provide a circuit board capable of making the electrically insulating layer to be homogenized and ultra-thin, and easily making the connection of an inner via including a paste to be more reliable. It is possible to provide a circuit board suitable for high density mounting. Furthermore, since the circuit board of the present invention has an IVH structure and is provided with a homogeneous and thin electrically insulating layer, the circuit board is suitable for high density mounting. Furthermore, the method for manufacturing the double-sided circuit board and a multilayer circuit board of the present invention can provide a circuit board that is extremely suitable for high density mounting. Moreover, the wiring layer of each embodiment may contain copper as a main component, the metal foil to be used for forming the wiring layer may be a copper foil. Furthermore, it is preferable in each method for manufacturing circuit boards that the mold release film is selected from polyethylene terephthalate (PET), polyethylene-2,6-naphthalate (PEN), and celluloses. Furthermore, it is preferable that the through hole and the non-through hole are provided by a method selected from a carbon dioxide gas laser, YAG laser, or excimer laser. In particular, the through hole can be provided by the use of a drill or a puncher. Furthermore, filling of the conductive paste may be carried out by the printing method using a squeegee, etc. However, filling of the conductive paste in a vacuum can increase the F value of the conductive paste more effectively. It is preferable that the circuit board is molded by a vacuum heat pressing. The present invention is not necessarily limited to the above-described embodiments.

EXAMPLE

Hereinafter, the circuit board using the circuit board electrically insulating material of the present invention and the circuit board manufactured by the manufacturing method of the present invention are described by way of specific Examples.

First, a method for manufacturing a circuit board electrically insulating material of the present invention is described.

On one surface of a 25 $\mu$m-thick polyethylene terephthalate (PET) film that is coated with a silicone based release mold agent, an epoxy resin containing the below-mentioned compositions ((1) to (4)) was coated by the use of a bar coater to a desired thickness and dried at 130° C. for 15 minutes so as to make the PET film to in a semi-hardened state. Next, a porous sheet was sandwiched between the PET films, and thermally pressed at the softening temperature of the resin (80° C.). Thereafter, only the PET film was peeled off from the laminate and resin layers were transferred to the both surfaces of the porous sheet. Thus, each circuit board electrically insulating material was obtained.

(1) brominated bisphenol A epoxy resin (amount of bromine: 23 weight %, epoxy equivalent: 270): 35 parts by weight (2) trifunctional epoxy resin (amount of bromine: 23 weight %, epoxy equivalent: 270): 35 parts by weight (3) phenol novolac resin type hardening agent (OH equivalent: 120): 30 parts by weight (4) 2-ethyl-4-methylimidazole: 0.2 parts by weight Furthermore, the pores of the porous sheet in the below mentioned Examples are continuous pores.

Example 1

A circuit board electrically insulating material was prepared by forming a 13 $\mu$m-thick epoxy resin on both surfaces of a porous polyimide film (thickness: 30 $\mu$m, porosity: 60 vol. %, average hole diameter: 2 $\mu$m). On both surfaces of the circuit board electrically insulating material, 12 $\mu$m-thick PET films were pressed at a temperature of 120° C. and a pressure of 2 kg/cm$^2$ to form a laminate. Thereafter, a through hole having a diameter of 75 $\mu$m was provided at a desired position of the laminate by a carbon dioxide gas laser. Next, the through hole was filled with a conductive paste containing the following compositions by a printing method, and then the PET films on both surfaces were peeled off at a temperature of 60° C.

(1) copper powder (average particle diameter: 5 μm): 87.5 parts by weight (2) bisphenol F epoxy resin: 3.0 parts by weight (3) epoxy resin in which dimer acid is glycidyl esterified: 7.0 parts by weight (4) amine adduct hardening agent: 2.5 parts by weight Then, the laminate from which the PET films had been peeled off was sandwiched by 12 μm-thick copper foils and heated and pressed by a thermal pressing method in a vacuum at a pressure of 50 kg/cm² at 200° C. for one hour to form a copper-clad laminate. Circuit patterns were formed on this copper-clad laminate by the etching method to form a double-sided circuit board.

Example 2

A double-sided circuit board was prepared by the same method as in Example 1 except that a circuit board electrically insulating material was prepared by forming a 13 μm-thick epoxy resin on both surfaces of a porous PTFE film (thickness: 30 μm, porosity: 80 vol. %, average pore diameter: 2 μm).

Example 3

A double-sided circuit board was prepared by the same method as in Example 1 except that a circuit board electrically insulating material was prepared by forming a 13 μm-thick epoxy resin on both surfaces of a porous aramid film (thickness: 30 μm, porosity: 80 vol. % and average hole diameter: 2 μm).

Example 4

A double-sided circuit board was prepared by the same method as in Example 1 except that a circuit board electrically insulating material was prepared by forming a 40 μm-thick epoxy resin on both surfaces of a porous glass film (thickness: 100 μm, porosity: 80 vol. %, average pore diameter: 1 μm) and a through hole having a hole diameter of 150 μm was provided on the circuit board by using a drill.

Example 5

A double-sided circuit board was prepared by the same method as in Example 1 except that a circuit board electrically insulating material was prepared by forming a 30 μm-thick epoxy resin on both surfaces of an aramid non-woven fabric ("Thermount (R)," product by Du Pont, thickness: 80 μm, porosity: 40 vol. % and bulk density: 0.8 g/cm³).

Example 6

A double-sided circuit board was prepared by the same method as in Example 1 except that the 15 μm-thick epoxy resin sheet (NIPPON KAYAKU CO., LTD.) was sandwiched between both surfaces of the porous polyimide film (thickness: 30 μm, porosity: 60 vol. %, average hole diameter: 2 μm) to form a laminate, and furthermore, 12 μm-thick PET films were pressed onto the both surfaces of the above-mentioned laminate at a temperature of 120° C. and a pressure of 2 kg/cm².

Example 7

A double-sided circuit board was prepared by the same method as in Example 1 except that on one surface of the 12 μm thick PET film, a 15 μm thick resin layer (including the above-mentioned compositions) was formed with a bar coater, and then porous polyimide (thickness: 30 μm, porosity: 60 vol. %, average hole diameter: 2 μm) was sandwiched by the resin layer side of the PET and pressed at a temperature of 120° C. and a pressure of 2 kg/cm².

Comparative Example 1

A double-sided circuit board was prepared by the same method as in Example 1 except that a circuit board electrically insulating material in which an aramid non-woven fabric (Thermount (R), product by Du Pont, thickness: 80 μm, porosity: 55 vol. %, bulk density: 0.6 g/cm³) impregnated with an epoxy resin was used.

Comparative Example 2

A double-sided circuit board was prepared by the same method as in Example 1 except that a circuit board electrically insulating material in which an aramid non-woven fabric (Thermount (R), product by Du Pont, thickness: 80 μm, porosity: 40 vol. % and bulk density: 0.8 g/cm³) impregnated with an epoxy resin was used.

Comparative Example 3

A double-sided circuit board was prepared by the same method as in Example 1 except that a circuit board electrically insulating material in which a porous glass (thickness: 100 μm, porosity: 80 vol. %, average hole diameter: 1 μm) impregnated with an epoxy resin was used.

Evaluation

Circuit boards of the Examples and Comparative Examples, having circuit pattern in which 500 inner via holes are located in series were manufactured for evaluation. The resistance value of the via connection of the circuit board for evaluation and the resistance value of the connection after the circuit boards for evaluation had been left under the conditions of 121° C./0.2 MPa/100% RH for 168 hours were measured. The change (PCT) of the values was evaluated. Table 1 shows the results.

First, when the initial connection resistance of the inner via hole was evaluated, except for Comparative Examples 2 to 3, the resistance value per inner via hole was an excellent value, 3 mΩ or less, in all cases of Examples 1 to 7 and Comparative Example 1.

TABLE 1

| Experiment No | Initial connecting resistance (mΩ/inner via hole) | change rate of connecting resistance (PCT) %/inner via hole | Aspect ratio |
| --- | --- | --- | --- |
| Ex. 1 | 4.2 | 23 | 0.4 |
| Ex. 2 | 4.2 | 24 | 0.4 |
| Ex. 3 | 4.0 | 20 | 0.4 |
| Ex. 4 | 5.5 | 33 | 1.0 |
| Ex. 5 | 5.2 | 36 | 1.1 |
| Ex. 6 | 4.4 | 21 | 0.4 |
| Ex. 7 | 4.1 | 23 | 0.4 |
| Co. Ex. 1 | 5.4 | 50 | 1.1 |
| Co. Ex. 2 | 8.6 | 150 | 1.1 |
| Co. Ex. 3 | 9.8 | 257 | 1.0 |

Ex. = Example
Co. Ex. = Comparative Example

The reason the connection resistance values of the inner via hole in the Comparative Examples 2 to 3 was high was because the compression rate of the electrically insulating material at the time of pressing was insufficient. On the other hand, in the case where the same porous sheets as those in Comparative Examples 2 to 3 were used (Examples 4 to 5), the resistance of the inner via hole was sufficiently small.

This is because a paste resin was ejected to a non-woven fabric when the conductive paste was printed, thus increasing the F value and because the compressive performance can be secured by the change in the thickness of the sheet due to the impregnation of the resin into the porous sheet at the time of pressing. Therefore, according to the circuit board electrically insulating material of the present invention, it is possible to provide a circuit board electrically insulating material that is more excellent in the compressive performance even in the case where the same reinforcing material is used. Furthermore, in Example 4, even when an inorganic material in which the porous sheet itself is not compressed is used (in Example 4, a porous glass), with the configuration of the circuit board electrically insulating material of the present invention, compression can be carried out.

Next, when Comparative Example 1 is compared with Examples 1 to 3 and 6 to 7, the initial resistance of the inner via hole is excellent in all the cases. However, in Comparative Example 1, the change rate (PCT) was 50% per inner via hole, while on the other hand, in Examples 1 to 3 and 6 to 7, the rate is less than 30%. The connection reliability is extremely excellent. This is because the compressive performance of Examples 1 to 3 and 5 to 7 is improved with respect to that of Comparative Example 1, and because the conductive paste is ejected to the porous sheet when the paste resin is printed. Furthermore, in Examples 1 to 3 and 6 to 7, since the thickness of the electrically insulating layer is extremely small, and the aspect ratio (ratio of electrically insulating layer thickness/diameter of inner via hole) is low, the connection reliability of the inner via hole can be improved. In the case of the porous sheet such as a non-woven fabric, since the diameter of fiber is 10–20 $\mu$m, it is extremely difficult to make the thickness of an electrically insulating layer to be about 30 $\mu$m.

As mentioned above, according to the present invention, since a high density structure having a hole diameter of several $\mu$m (porous sheet) is used as a reinforcing material, it is possible to make the circuit board to be homogenized and thin and at the same time to make the diameter of the inner via hole to be small easily. Furthermore, even if a reinforcing material in which a porous sheet itself has a small compressive performance is used, a circuit board having an inner via hole with a high connection reliability can be provided. Therefore, it is possible to provide a circuit board having an IVH (interstitial inner via hole) structure by using a high density sheet, which has been difficult in the case of using the conventional material (prepreg using an aramid non-woven fabric). On the other hand, it is possible to make the electrically insulating layer to be homogenized and thin by making the sheet to be high density.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board electrically insulating material in sheet form, comprising:
   a porous sheet; and
   a resin layer laminated to a surface of the porous sheet,
   wherein at least a portion of the resin layer is not impregnated in pores that are present inside the porous sheet, and
   only a central portion of the porous sheet is not impregnated with resin from the laminated resin layer and the circuit board insulating material has a thickness sufficiently small for use in a circuit board.

2. The circuit board electrically insulating material according to claim 1, wherein hollow pores are present in at least the central portion of the porous sheet and the volume of the pores is 10 vol. % or more and 45 vol. % or less with respect to the entire volume of the circuit board electrically insulating material.

3. The circuit board electrically insulating material according to claim 1, wherein the maximum hole diameter of the pores is 10 $\mu$m or less.

4. The circuit board electrically insulating material according to claim 1, wherein the porous sheet comprises one selected from the group consisting of an organic material and ceramics.

5. The circuit board electrically insulating material according to claim 4, wherein the organic material comprises at least one material selected from the group consisting of polytetrafluoroethylene (PTFE), polyimide, aromatic polyamide, and aromatic polyester.

6. The circuit board electrically insulating material according to claim 1, wherein the porous sheet is a non-woven fabric containing a synthetic fiber as a main component.

7. A circuit board comprising:
   a plurality of electrically insulating layers and wiring layers which are laminated alternately, and
   an inner via hole for securing an electrical connection between the wiring layers by compressing and hardening a conductive paste including a conductive particle and a resin; wherein:
   the electrically insulating layer comprises a porous sheet in which a resin layer is laminated to at least one surface, at least a portion of the resin layer is impregnated in pores that are present inside the porous sheet, and only a central portion of the porous sheet is not impregnated with a resin from the laminated resin layer;
   a through hole, which is provided for making the inner via hole, penetrating the electrically insulating layer in the thickness direction of the electrically insulating layer is filled with a conductive paste including a conductive particle and a resin, and pores that are present inside the porous sheet are filled with resin from the laminated resin layer; and
   the average hole diameter of the pores that are present inside the porous sheet is smaller than the average particle size of the conductive particle.

8. The circuit board according to claim 7, wherein the electrically insulating layer provided with the inner via hole including a conductive particle and a resin is formed by filling the pores of the porous sheet with a resin simultaneously with compressing and hardening the conductive paste.

9. The circuit board according to claim 7, wherein the maximum hole diameter of the pores of the porous sheet is 10 $\mu$m or less.

10. The circuit board according to claim 7, wherein the porous sheet comprises one selected from the group consisting of an organic material and ceramics.

11. The circuit board according to claim 10, wherein the organic material comprises at least one material selected from the group consisting of polytetrafluoroethylene (PTFE), polyimide, aromatic polyamide, and aromatic polyester.

* * * * *